(12) United States Patent
Kobayashi

(10) Patent No.: US 6,901,249 B1
(45) Date of Patent: May 31, 2005

(54) COMPLEMENTARY BIPOLAR HARMONIC MIXER

(75) Inventor: Kevin W. Kobayashi, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 560 days.

(21) Appl. No.: 09/324,237

(22) Filed: Jun. 2, 1999

(51) Int. Cl.[7] .................................................. H04B 1/28
(52) U.S. Cl. ...................... 455/333; 455/327; 455/190.1
(58) Field of Search ................................. 455/313, 319, 455/323, 326, 333, 334, 130, 131, 327, 189.1, 190.1, 252.1

(56) References Cited

U.S. PATENT DOCUMENTS

| | | | |
|---|---|---|---|
| 4,193,036 A | * | 3/1980 | Cerny, Jr. et al. ........... 455/327 |
| 4,684,833 A | * | 8/1987 | Rinderle ...................... 307/525 |
| 4,850,039 A | * | 7/1989 | Muterspaugh ............... 455/333 |
| 6,230,001 B1 | * | 5/2001 | Wyse .......................... 455/326 |

OTHER PUBLICATIONS

Cohn, Martin et al. "Harmonic Mixing with an Antiparallel Diode Pair", *IEEE Trans. Microwave Theory Tech.*, vol. MTT–23, pp. 667–673, Aug. 1975.

* cited by examiner

*Primary Examiner*—Congvan Tran
(74) *Attorney, Agent, or Firm*—Katten Muchin Zavis Rosenman; John S. Paniaguas

(57) ABSTRACT

A 3-terminal harmonic mixer which solves the conversion gain, port impedance and isolation problems associated with known harmonic mixers. In particular, the 3-terminal harmonic mixer in accordance with the present invention provides harmonically pumped anti-parallel diode mixing operation by utilizing the inherent characteristics of complementary transistors.

20 Claims, 15 Drawing Sheets

Noise sideband mixing products

Conversion loss versus LO power for MIC mixer ic mixer and
COMPLEMENTARY BIPOLAR HARMONIC MIXER

BACKGROUND OF THE INVENTION

1. Field of the Invention

The present invention relates to a harmonic mixer and more particularly, to a harmonic mixer configured from complementary logic 3-terminal devices which provide improved conversion gain, port impedance and isolation relative to known harmonic mixers.

2. Description of the Prior Art

Harmonic mixer-based frequency converters are useful in receiver applications and offer: lower phase noise through the use of a lower frequency voltage controlled oscillator (VCO); lower noise figure by suppressing the local oscillator (LO) noise sidebands; and reduction of baseband interference due to excellent LO radio frequency (RF) isolation and suppression of the LO self-mixed baseband products. In some cases, where the VCO frequency capability is limited by the device technology, a subharmonically pumped harmonic mixer approach provides a practical means of generating a high frequency LO source. Moreover, in cases where very low phase noise performance is required, a lower frequency VCO may be used and either frequency multiplied up to the LO source frequency or directly fed into a harmonic mixer as shown in FIG. 1. In particular, FIG. 1 illustrates that the subharmonically pumped mixer approach can result in superior phase noise performance due to the use of a lower frequency and lower phase noise (higher Q-resonator) VCO design compared to a fundamental frequency VCO employing a lower Q-resonator at a high frequency.

Conventional harmonic mixers are configured with anti-parallel diodes as the mixing elements and possess the characteristic of generating an effective conductance, g, which consists of a dc component and even harmonics of the LO frequency. FIG. 2 illustrates an anti-parallel mixing device in a subharmonic mixer application. The nonlinear characteristics of the anti-parallel diodes enable the generation of the subharmonically pumped LO mixing products $\omega_{IF}=m \cdot \omega_{LO} \pm n \cdot \omega_{RF}$ where m+n=1,3,5 . . . . A detailed description of operation of an anti-parallel harmonic mixer is described in detail in Cohen et al, "Harmonic Mixing With an Antiparallel Diode Pair", *IEEE Transactions on Microwave Theory and Techniques*, vol. MTT-23, pp. 667–673, August 1975, hereby incorporated by reference.

However, there are many practical design drawbacks to the use of the harmonic diode mixer. One such drawback is the bilateral nature of the LO, RF, and intermediate (IF) ports of the conventional anti-parallel diode harmonic mixer shown in FIG. 2. Since the anti-parallel diodes are strictly two terminal devices and do not provide unilateral characteristics, it does not provide signal directivity which typically is characteristic of 3-terminal solid-state devices, such as bipolar transistors. The consequence is that the isolation between the output IF port and the input LO and RF ports is strictly determined by the filter and passive networks in series with each port. The matching on one port will be dependent on the out of band impedances of the filters and matching networks of the other ports and visa versa. In particular, spurious mixer products can be produced by the back reflection of the IF mixer output products which do not see a matched 50Ω since they are out of the IF band. This can result in poorer mixer conversion efficiency. Another drawback is that the anti-parallel diode mixing device is typically a low dynamic impedance device that is very dependent on the LO drive level and can present sensitivity problems. This low impedance is seen by each of the RF, LO, and IF ports which sometimes results in less than optimum performance when the LO operating power is varied from its optimally matched LO power condition. Yet, the major disadvantage is that the anti-parallel diodes cannot produce conversion gain since it is a 2-terminal device with an output resistance equal to the reciprocal of its conductance whereas, the employment of a 3-terminal device, such as a bipolar transistor offers the ability to provide gain due to its unilateral characteristics which enables it to have a high output resistance, much higher than the reciprocal of its tranconductance. These and other shortcomings can compromise the overall performance and operation of the anti-parallel diode based subharmonically pumped mixer. Thus, there is a need for a harmonic mixer with improved conversion gain, port impedance and isolation relative to known harmonic mixers.

SUMMARY OF THE INVENTION

Briefly, the present invention relates to a 3-terminal complementary logic harmonic mixer which solves the conversion gain, port impedance and isolation problems associated with known harmonic mixers. In particular, the 3-terminal harmonic mixer in accordance with the present invention provides harmonically pumped anti-parallel diode mixing operation by utilizing the inherent characteristics of complementary transistors.

DESCRIPTION OF THE DRAWINGS

These and other advantages of the present invention will be readily understood with reference to the following specification and attached drawing wherein.

DETAILED DESCRIPTION

The present invention relates to a harmonic mixer and more particularly, to a harmonic mixer formed from 3 terminal devices and more particularly, to a harmonic mixer formed from complementary transistors. The harmonic mixer in accordance with the present invention provides increased conversion gain, isolation and port impedance relative to known harmonic mixers formed from 2 terminal devices.

Figure 3A:
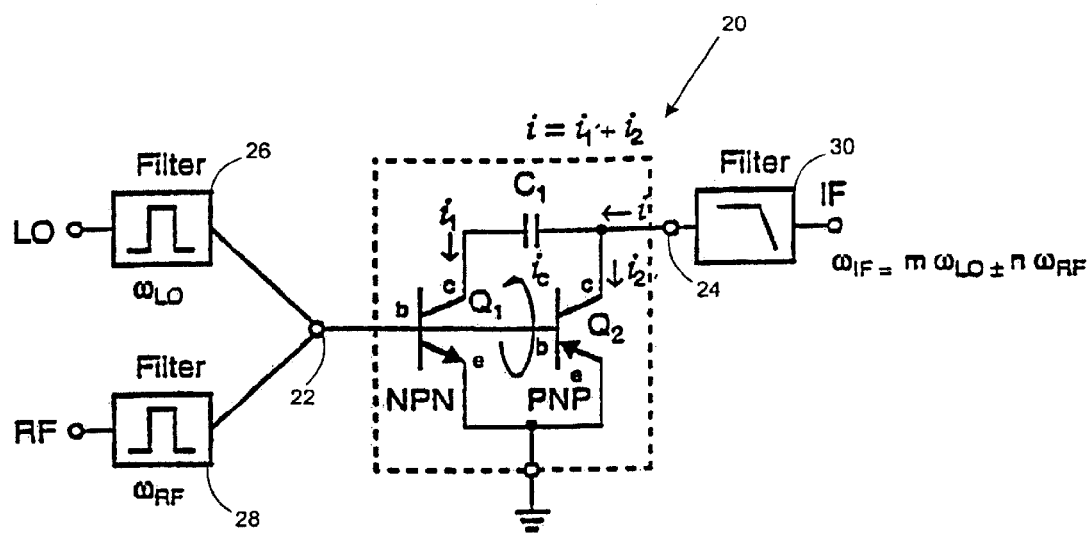
FIG. 3a is a schematic diagram of the complementary bipolar harmonic mixer in accordance with the present invention.

FIG. 3a illustrates an embodiment of the present invention implemented with complementary NPN and PNP bipolar transistors. The principles of the present invention are also applicable to complementary metal oxide semiconductor (CMOS) transistors formed from NMOS and PMOS devices, and in general, all classes of complementary 3-terminal devices including high electron mobility transistors (HEMTs), homojunction bipolar junction transistors (BJTs) and heterojunction bipolar transistors (HBTs).

The subharmonic local oscillator (LO) pumped mixer in accordance with the present invention includes an LO and radio frequency (RF) input port and an intermediate frequency (IF) output port, each port coupled to a filter or passive matching network which feeds the input (LO, RF) and output (IF) terminals of the complementary bipolar subharmonically pumped nonlinear mixer device. The mixer device, generally identified with the reference numeral 20, consists of an NPN transistor $Q_1$ and a PNP transistor $Q_2$, connected such that the base terminals and emitter terminals of the transistors $Q_1$ and $Q_2$ are directly connected together. The base terminals of the transistors $Q_1$ and $Q_2$, form an input port 22 while the collector terminals of the transistors $Q_1$ and $Q_2$ are connected together, and, in turn, to an output port 24. The input port 22 is connected to a bandpass filter 26 for passing the LO frequency $\omega_{LO}$ and another bandpass filter 28 for passing the RF frequency $\omega_{RF}$. The input terminals to the filters 26 and 28 form an LO and an RF port of the mixer 20. The output terminal 24 of the mixer 20 is connected to a low pass filter, whose output forms an intermediate frequency (IF) port.

Figure 1:
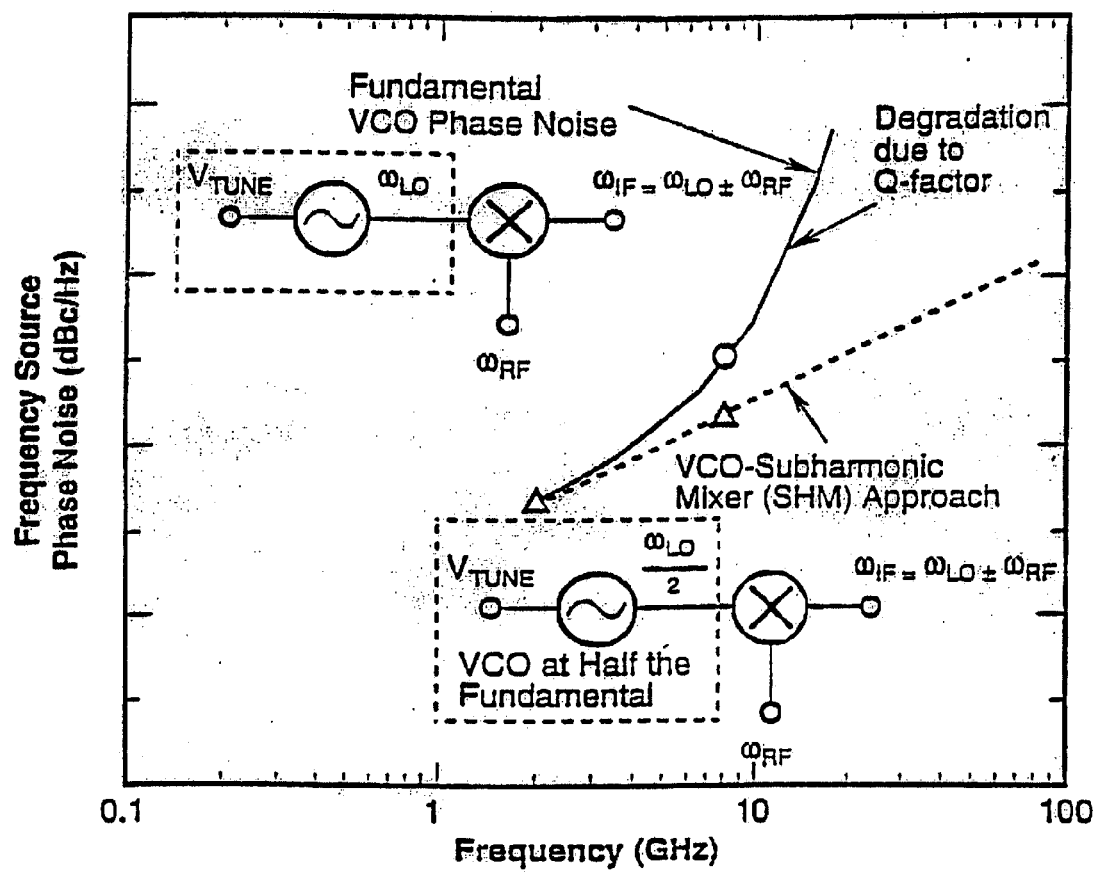
FIG. 1 is a graphical illustration of the phase noise as a function of frequency illustrating the qualitative phase noise comparison of the fundamental frequency VCO and VCO subharmonic mixer converter approaches.
Figure 2:
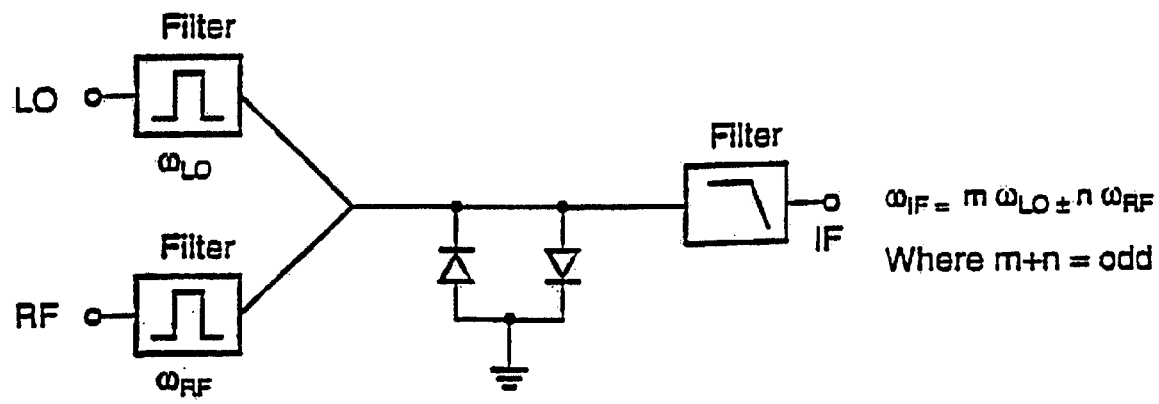
FIG. 2 is a schematic diagram of a known anti-parallel diode harmonic mixer.

An optional capacitor C1 may be used to provide ac coupling of the collectors of the transistors $Q_1$ and $Q_2$. The capacitor C1 performs dc blocking and enables the collector of the transistor $Q_1$ to be biased by a positive voltage independently of the collector of $Q_2$ which is biased by a negative voltage. The output can be taken directly from either collector. The emitters of the transistors $Q_1$ and $Q_2$ which share a common node is typically grounded. The anti-parallel diode harmonic mixer action is provided by the parallel complementary NPN and PNP bipolar transistors instead of the anti-parallel diodes of the prior art as illustrated in FIG. 2. Since the bipolar transconductance characteristics are similar to the conductance characteristics of a diode, the harmonic mixing action is preserved in this topology. However, by using the unilateral NPN and PNP bipolar devices $Q_1$ and $Q_2$, additional benefits result, such as improved IF-RF and IF-LO isolation, which will suppress the undesired spur products generated by back-reflected signals at the IF which are remixed. Furthermore, the RF and LO inputs are isolated from the circulating mixer currents Ic, I1, and I2 of the actual mixing mechanism because of the high impedance and forward current gain properties of the bipolar devices. In addition, the input and output impedances are larger (relative to the reciprocal of the tranconductance) and are easier to match to and are less sensitive to LO drive level compared to the anti-parallel approach of prior art. These attributes enhance the overall performance of the harmonic mixer in accordance with the present invention. And finally, due to the unilateral and gm characteristics of the bipolar devices, mixer conversion gain is possible. Since the operation of the mixer is similar to that of the anti-parallel diode mixer, that is, it consists of two oppositely polarized devices in parallel, the complementary harmonic mixer will generate the harmonic mixing products $\omega IF = m \cdot \omega_{LO} \pm n \cdot \omega_{RF}$ where m+n=1,3,5, . . . . The analytic operation of the complementary bipolar harmonic mixer is analogous to that of the anti-parallel diode mixer in harmonic mixing.

Figure 3B:
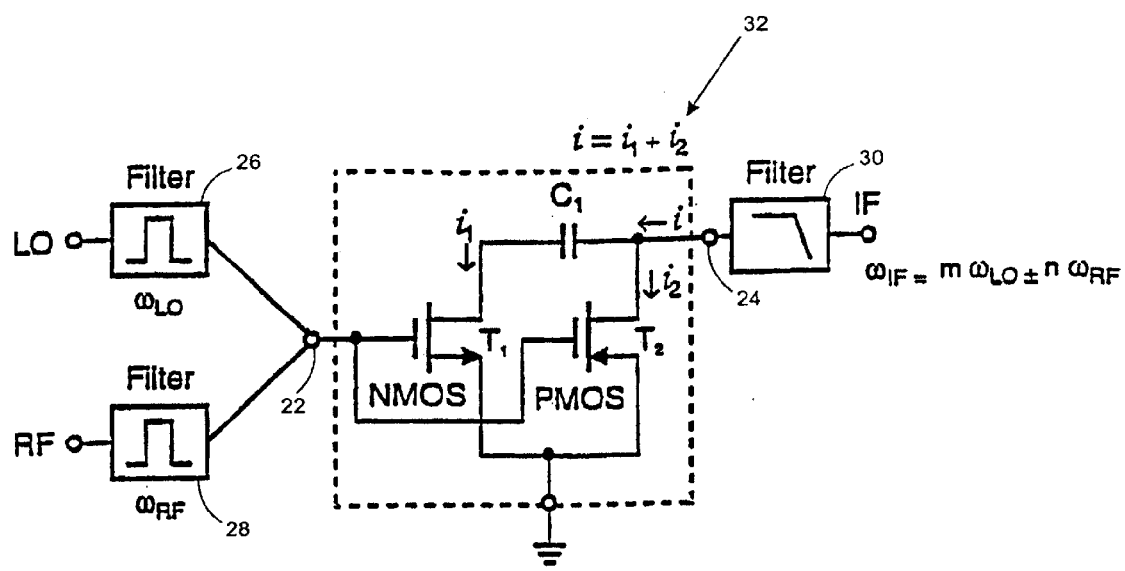
FIG. 3b is similar to FIG. 3a, except the mixer is implemented in CMOS technology.

FIG. 3b illustrates an embodiment of the harmonic mixer illustrated in FIG. 3a using complementary metal oxide semi-conductor (CMOS) transistors T1 and T2. As shown, the transistor T1 is an NMOS device while the transistor T2 is a PMOS device.

Figure 4:
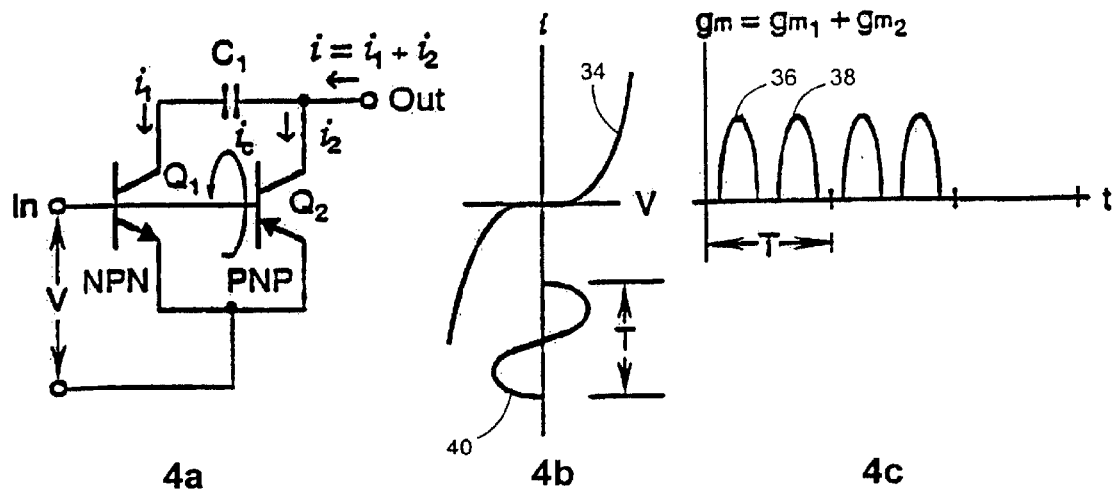
FIG. 4a is similar to FIG. 3a, except the circuit is not grounded.
FIGS. 4b and 4c are graphical illustrations showing the I-V and time varying tranconductance characteristics of the LO pumped complementary bipolar harmonic mixer device in accordance with the present invention compared to a known harmonic mixer.
FIGS. 4d–4f are similar to FIGS. 4a–4c except that the mixer is implemented in CMOS technology.
Figure 4:
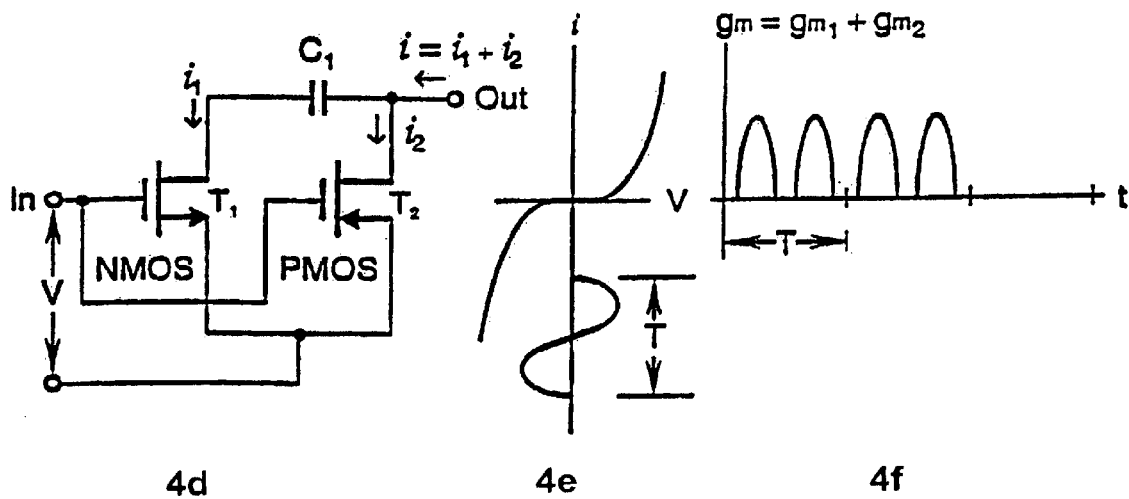

FIG. 4a illustrates a complementary bipolar harmonic mixer device in accordance with an embodiment of the present invention. In particular, FIG. 4a is similar to the harmonic mixer illustrated in FIG. 3A with the exception that the common emitter of the transistors $Q_1$ and $Q_2$ is not grounded. An applied voltage, V, produces collector currents I1 and I2 of NPN transistor $Q_1$ and PNP transistor $Q_2$, respectively. Assuming that the dc current gain of $Q_1$ and $Q_2$ are very high (infinite), the collector and emitter currents of a given device type is equal (I1=Ic1=Ie1, I2=Ic2=Ie2). The instantaneous collector currents through the transistors $Q_1$ and $Q_2$ may be written by the following:

$$i_1 = i_s(e^{\alpha V} - 1) \qquad (1)$$

$$i_2 = -i_s(e^{-\alpha V} - 1) \qquad (2)$$

where $\alpha = q/nKT$.

Similarly, the differential transconductance for each transistor may be written as $$g_{m1} = \frac{di_1}{dV} = \alpha i_{i_s} e^{+\alpha v} \quad (3)$$

$$g_{m2} = \frac{di_2}{dV} = \alpha i_{i_s} e^{-\alpha v} \quad (4)$$

The composite time varying differential transconductance Gm is simply the sum of the individual differential transconductances (since they are in parallel).

$$g_m = g_{m1} + g_{m2} = \alpha i_s (e^{\alpha V} + e^{-\alpha V}) \quad (5)$$
$$= 2\alpha i_{s\cosh}(\alpha V)$$

Examination of this expression reveals that transconductance Gm has even symmetry with the voltage V between the base terminal of the transistor $Q_1$ and the common emitter terminal as illustrated by the curve 34 in FIG. 4b and produces double the number of conductance pulses per LO cycle as illustrated by the pulses 36 and 38 in FIG. 4c compared to a single diode mixer, as shown by the curve 40 in FIG. 4b. This is a key characteristic which allows this invention to be applied to all classes of complementary 3-terminal device technologies. FIGS. 4d, 4e and 4f illustrate the same for harmonic mixers in accordance with the present invention implemented in CMOS technology.

For the usual case in which only the LO modulates the transconductance of the bipolar transistors the expression V=VLO cos $\omega_{LO}t$ may be substituted into equation (5) resulting in equation (6)

$$g_m = 2\alpha i_s \cos h(\alpha V_{LO} \cos \omega_{LO} t) \quad (6)$$

which may be expanded in the following series as indicated in equation (7) below:

$$g_m = 2\alpha i_s [I_0(\alpha V_{LO}) + 2I_2(\alpha V_{LO})\cos 2\omega_{LO}t + 2I_4(\alpha V_{LO})\cos 4\omega_{LO}t \quad (7)$$

where $I_n(\alpha V_{LO})$ are modified Bessel functions of the second kind. Notice that the transconductance components consist of a dc term plus even harmonics of the LO frequency. For the applied voltage, $V = V_{LO} \cos \omega_{LO}t + V_{RF} \cos \omega_{RF}t$, the current expression is (i=$G_m$V)

$$i = g_m(V_{LO}\cos\omega_{LO}t + V_{RF}\cos\omega_{RF}t) \quad (8)$$

$$i = A\cos\omega_{LO}t + B\cos\omega_{RF}t + C\cos3\omega_{LO}t + \quad (9)$$
$$D\cos5\omega_{LO}t + E\cos(2\omega_{LO} + \omega_{RF})t +$$
$$F\cos(2\omega_{LO} - \omega_{RF})t + G\cos(4\omega_{LO} + \omega_{RF})t +$$
$$H\cos(4\omega_{LO} - \omega_{RF})t + \ldots$$

The total current i only contains frequency terms $\omega_{IF}$= m·$\omega_{LO}$±n·$\omega_{RF}$, where m+n is odd, i.e., m+n=1,3,5, . . . . In FIG. 4a a circulating current $i_c$ is also indicated. As in the anti-parallel diode case discussed in "Harmonic Mixing with an Antiparallel Diode Pair", supra, the current arises from the fact that Fourier expansions of the individual currents $i_1$ and $i_2$ reveal that certain components of each current are oppositely phased. Because of their opposite polarity, these components cancel as far as the external current I is concerned and simply circulate within the loop formed by the two transistors. The complementary transistors will have the advantage of suppressing fundamental and other odd harmonic mixing products as well as even harmonics of the LO or products where m+n=even.

This complementary harmonic mixer invention has great implications in new receiver architectures, such as a direct-conversion receiver as illustrated. Direct conversion receivers are now heavily being explored by universities such as UCLA (Abidi) and commercial wireless companies because of its simplistic architecture which can significantly reduce the RF component count and eliminate the large passive filters that are typically required, enabling them to achieve a low cost "single-chip" transceiver+baseband processor integrated circuit (IC) solution. By going to the direct-conversion receiver approach, the portable handheld unit can be significantly reduced in both size and cost (BOM) by employing this single chip IC approach. In addition, the direct-conversion receiver also offers performance benefits as well, but can be improved by the use of a high performance subharmonic mixer.

Figure 5:
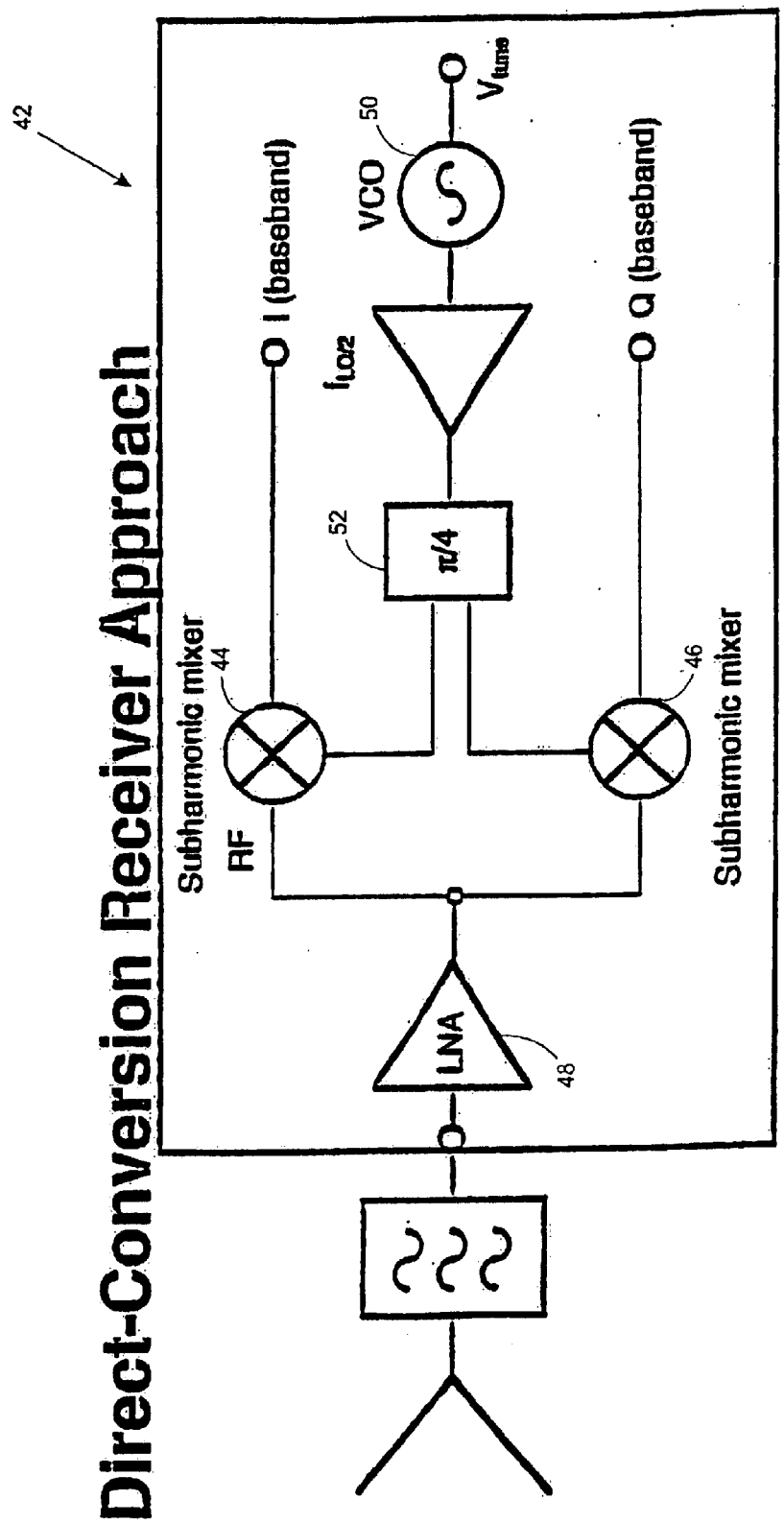
FIG. 5 is a simplified block diagram of a direct-conversion receiver which employs subharmonic mixers in accordance with the present invention.
Figure 6:
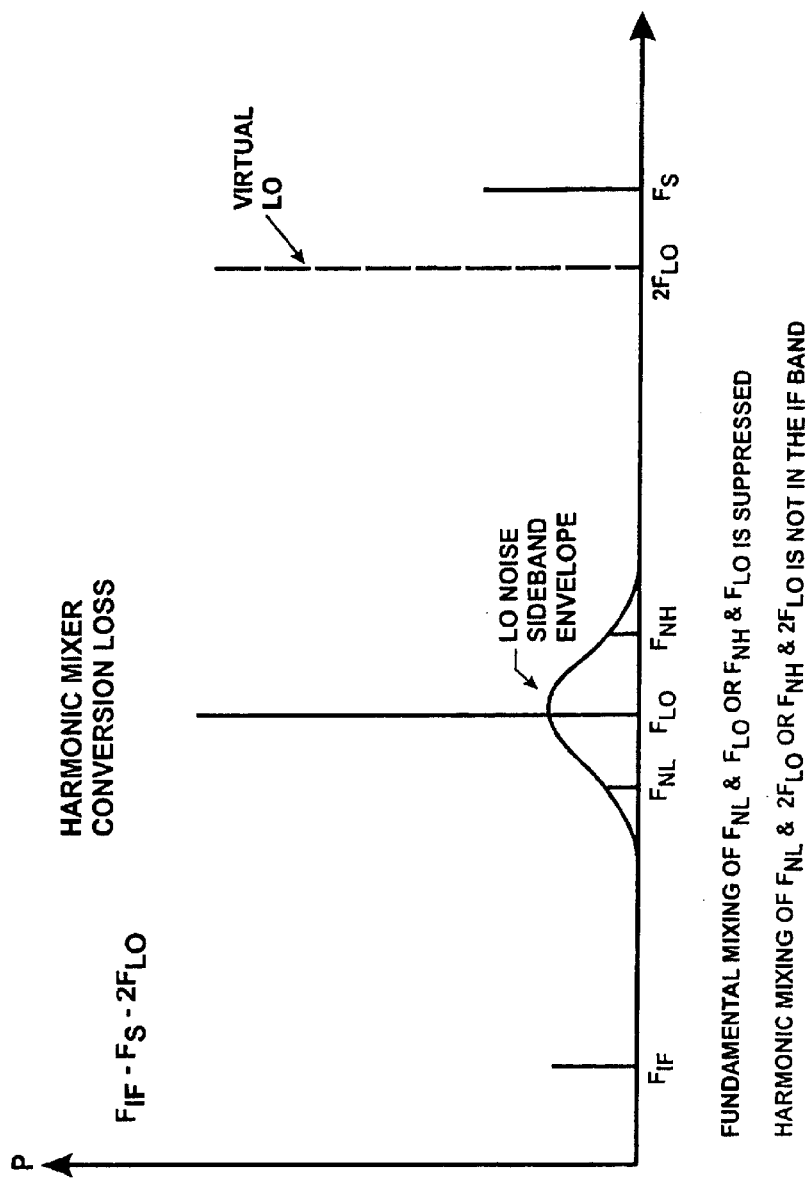
FIG. 6 is a graphical illustration that shows that the fundamental mixing of the LO phase noise sidebands down to the IF baseband is suppressed in the subharmonic mixer in accordance with the present invention.

FIG. 5 illustrates a simplified block diagram of a direct-conversion receiver, generally identified with the reference numeral 42 which employs subharmonic mixers 44 and 46. The electronics portion of the receiver 42 consists of a low noise amplifier (LNA) 48 which is fed directly into a pair of subharmonic mixers 44 and 46 for directly converting the RF signal to the I and Q baseband channels. A voltage controlled oscillator (VCO) 50 provides the LO source signal at half the RF frequency and is fed into a 45 degree phase splitter 52 which feeds the LO into the matched subharmonic mixers 44 and 46. The key to the performance of the direct-conversion mixer is the use of the subharmonic mixers 44 and 46. The subharmonic mixers 44 and 46 improve the direct-conversion receiver performance by: 1) suppressing the baseband dc offset produced from the LO source frequency mixing with itself at the RF port, 2) suppressing the harmonically related LO source signals leaking to the antenna at the RF port, 3) reducing the impact of the LO sideband noise through the suppression of the fundamental mixing of the LO sideband noise to the IF baseband or DC outputs. This last advantage has been described in "Harmonic Mixing With an Antiparallel Diode Pair," supra and is illustrated in FIG. 6. FIG. 6 shows that the fundamental mixing of the LO phase noise sidebands down to the IF baseband is suppressed in the subharmonic mixer. However this will be a function of how well the anti-parallel diodes or transistors are balanced. The second harmonic mixing of the LO phase noise sidebands will produce noise which is outside the IF band.

Although the subharmonic mixer is key to improving the performance of the direct-conversion receiver, its practical realization using the conventional anti-parallel diode approach has several drawbacks. In a typical anti-parallel diode subharmonic mixer, 1) high LO drive>13 dBm is usually required, 2) practical conversion losses of >−8 are typical, and 3) the size is typically large due to the need of passive matching, filtering, and harmonic trapping networks, especially as the frequency of operation is reduced below 6 GHz. Table 1 below illustrates how the complementary bipolar harmonic mixer in accordance with the invention, compares with the conventional anti-parallel diode harmonic mixer.

TABLE 1

Complementary Logic vs. Conventional Harmonic Mixers

| Performance Parameter | Complementary Bipolar Harmonic Mixer of This Invention | Conventional Anti-Parallel Diode Harmonic Mixer |
|---|---|---|
| Typical LO Drive Requirement | <+5 dBm | 13–20 dBm |
| (1,–2) Mixer Product Conversion Gain | >0 dB | <–6 dB |
| Typical Mixer Core DC Power Consumption | 5–50 mW | 0 |

TABLE 1-continued

Complementary Logic vs. Conventional Harmonic Mixers

| Performance Parameter | Complementary Bipolar Harmonic Mixer of This Invention | Conventional Anti-Parallel Diode Harmonic Mixer |
| --- | --- | --- |
| Addition DC Power Due to LO Amplifier (+5 dBm IN) assuming 30% LO Amp Efficiency | 0 | 60 to 300 mW |
| Total DC Power Consumption | 5–50 mW | 60–300 mW |
| Size Consideration | Compact Analog IC | Large Microwave Tuned Circuit |

Figure 7:
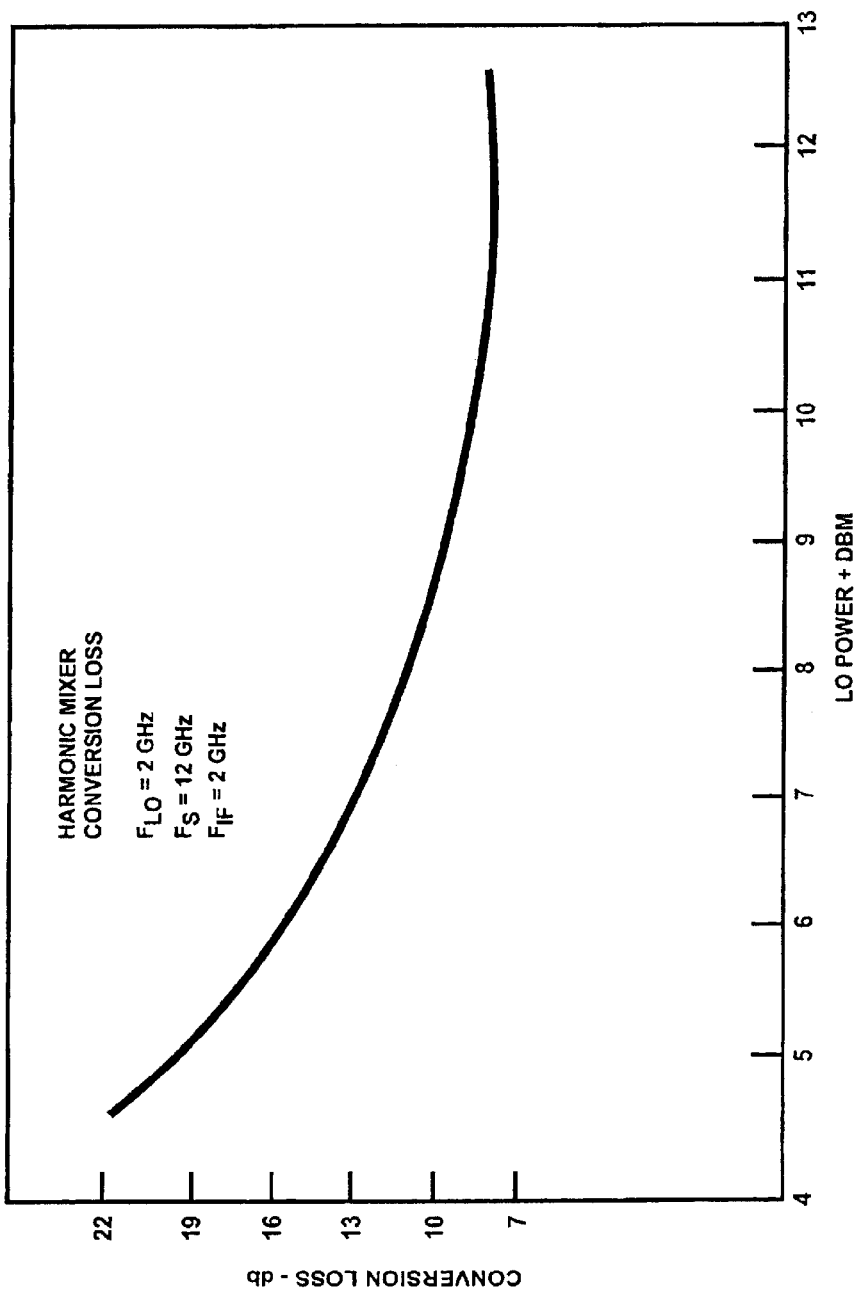
FIG. 7 is a graphical illustration of the conversion loss as a function of power of a high LO drive required to operate a known anti-parallel diode harmonic mixer.

The present invention typically requires 8–15 dB lower LO drive than the conventional anti-parallel diode mixer while providing conversion gain instead of the typical −8 dB of conversion loss. The high LO drive required to operate a typical anti-parallel diode harmonic mixer is given in FIG. 7. The LO drive required can profoundly impact the dc power of the system. Although the present invention consumes somewhere between 5–50 mW of dc power for the mixer core compared to 0 mW for the diode harmonic mixer core, after adding in an LO amplifier for the diode mixer to compensate for its higher mixer LO drive requirement, the total dc power consumption of the diode harmonic mixer will be about an order of magnitude higher for an equivalent LO port drive of 5 dBm. Also of great advantage is that the complementary bipolar harmonic mixer of this invention will be significantly smaller in chip area to accommodate lower cost and easier monolithic integration with the other RF and baseband signal processing components.

Figure 8:
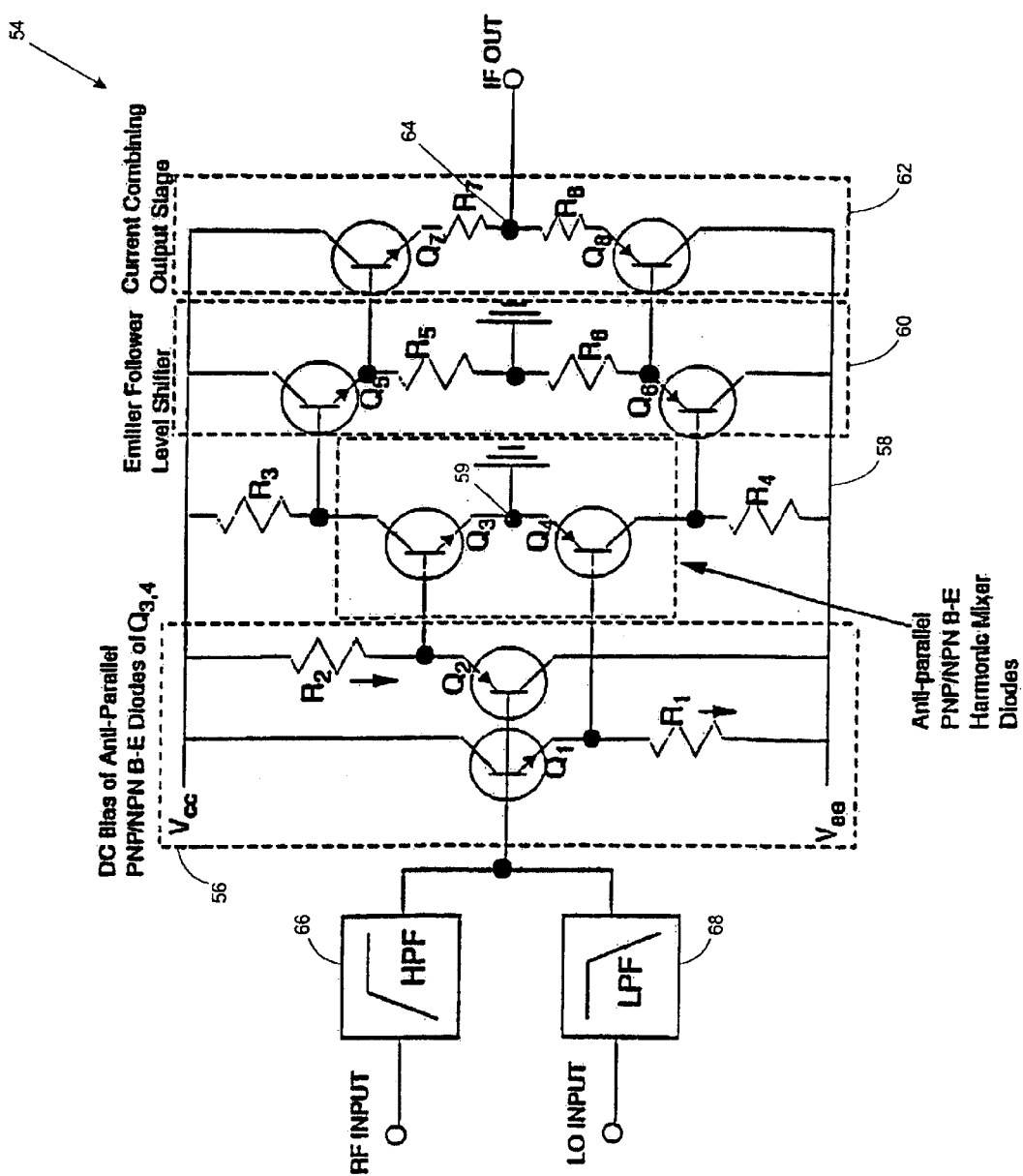
FIG. 8 is a schematic diagram of one embodiment of the present invention used in a direct-conversion receiver application.

FIG. 8 shows a specific embodiment of the present invention using complementary heterojunction bipolar transistors for use in a direct-conversion receiver application. The receiver, generally identified with the reference numeral 54 includes a DC bias stage 56 which includes the transistors $Q_1$ and $Q_2$ and resistors $R_1$ and $R_2$, a harmonic mixer stage 58 which includes a pair of complementary transistors $Q_3$ and $Q_4$ whose emitter terminals are connected together at a node 59 which is optionally connected to ground and a pair of resistors $R_3$ and $R_4$; an optional emitter follower stage 60 which includes two transistors $Q_5$ and $Q_6$ and two resistors $R_5$ and $R_6$; and an output stage 62 which includes two transistors $Q_7$ and $Q_8$ and two resistors $R_7$ and $R_8$. The resistors $R_7$ and $R_8$ are serially connected defining a node 64 therebetween. The node 64 is connected to an output port IF OUT. The base terminals of the transistors $Q_1$ and $Q_2$, in the DC bias stage 56 are connected to a high pass filter (HPF) 66 which, in turn, is connected to the RF input port as well as a low pass filter (LPF) that is connected to a LO input port.

The core of this harmonic mixer is comprised of the emitter grounded complementary NPN and PNP transistor pair $Q_3$ and $Q_4$, respectively. In contrast to the original embodiment of FIGS. 2 and 3, the base terminals are not directly connected together, but connected to a pair of NPN and PNP transistors $Q_1$ and $Q_2$, respectively.

In particular, the emitter of PNP transistor $Q_2$ is connected to the base of NPN transistor $Q_3$ while the emitter of NPN transistor $Q_1$ is connected to the base of PNP transistor $Q_4$. The bases of both $Q_1$ and $Q_2$ are connected together and share the same input terminal. The transistors $Q_1$ and $Q_2$ and resistors $R_1$ and $R_2$ comprise an input circuit to the anti-parallel complementary transistors $Q_3$, $Q_4$ which aids in providing a DC bias to the bases of $Q_3$ and $Q_4$ which effectively lowers the LO drive requirement of the harmonic mixer. Resistors $R_1$ and $R_2$ act as current sources which effectively bias transistors $Q_1$ and $Q_2$ for adjusting the dc turn-on threshold voltages of the harmonic mixer LO input. Because of the subharmonically pumped operation, a high pass filter at the RF port can suppress any fundamental LO signal from leaking to the antenna. Likewise, a low pass filter at the LO port can be used to reject the RF signal leakage to the LO. Simple high and low pass filters can be used since the fundamental RF and LO tones are conveniently separated by an octave in frequency due to the subharmonic pumped mixer operation.

In order to obtain direct-conversion down to dc, the dc blocking capacitor C1 of FIG. 2 is replaced by a complementary emitter follower stage 60, which shares a dc ground and provides a 1 diode level shift. This stage includes an NPN and a PNP transistor $Q_5$ and $Q_6$ as well as bias resistors $R_5$ and $R_6$. Additional load resistors $R_3$ and $R_4$ on the collectors of the anti-parallel NPN and PNP transistors $Q_3$ and $Q_4$, respectively, may be used to adjust the conversion gain-bandwidth response of the harmonic mixer, as well as provide additional dc level shift. These resistive loads can alternatively be replaced by a frequency dependent impedance such as a series inductor and resistor. Resistive loads will typically allow IF performance down to dc.

A final stage 62 which includes complementary follower output stage is used to combine the complementary voltages and currents generated at the collector nodes of transistors $Q_3$ and $Q_4$. This output stage includes an NPN and a PNP transistor $Q_7$ and $Q_8$, respectively, which provide another diode level shift. The emitters of these transistors $Q_7$ and $Q_8$ are coupled to the output through series resistors $R_7$ and $R_8$. These resistors $R_7$ and $R_8$ shift the remaining dc voltages to zero and also provide a means for matching the IF output impedance. A monolithic low pass filter at the output (not shown) may be integrated before the DC IF signal is processed.

Figure 9:
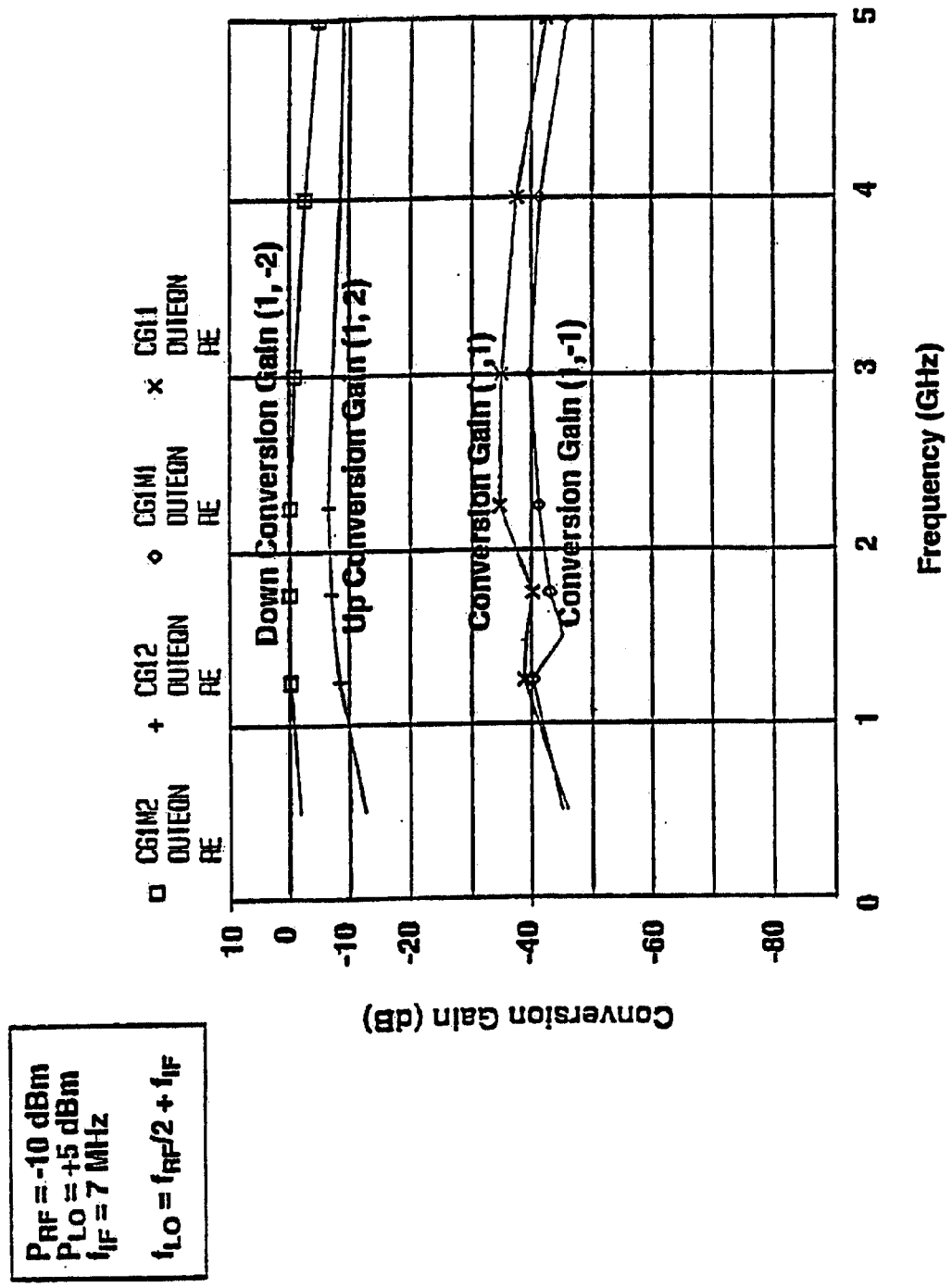
FIG. 9 is a graphical illustration of the conversion gain as a function of frequency of the complementary bipolar subharmonic mixer of FIG. 8, but without the low-pass and high-pass filters.

FIG. 9 illustrates the conversion gain of the complementary bipolar subharmonic mixer of FIG. 8, but without the low-pass and high-pass filters 66 and 68. For convenience, a fixed IF frequency of 7 MHz was chosen, although the mixer is capable of a DC IF output. The RF signal is swept from 500 MHz to 5 GHz and while the LO was swept at half the RF frequency plus the IF (fLO=fRF/2+fIF). The RF input power is −10 dBm and the LO power was set at +5 dBm. FIG. 9 illustrates that the desired 2nd harmonic LO pumped down conversion gain (RF=1, LO=−2) was better than −5 dB across a 500 MHz-5 GHz band with a peak conversion gain of 0 dB at 2 GHz. This is pretty good considering no impedance matching has been employed for the RF or LO inputs. In fact, this conversion gain performance is much better than what can practically be achieved with an anti-parallel schottky diode harmonic mixer, even at its optimum LO power which is typically 10 dB higher. The up conversion gain (RF=1, LO=+2) is slightly lower due to the limited frequency response of the IF output network. Fundamental conversion gains (RF=1, LO=1) and (RF=1, LO=−1) are both below −35 dB, and illustrates the natural cancellation of the even order mixer products.

Figure 10:
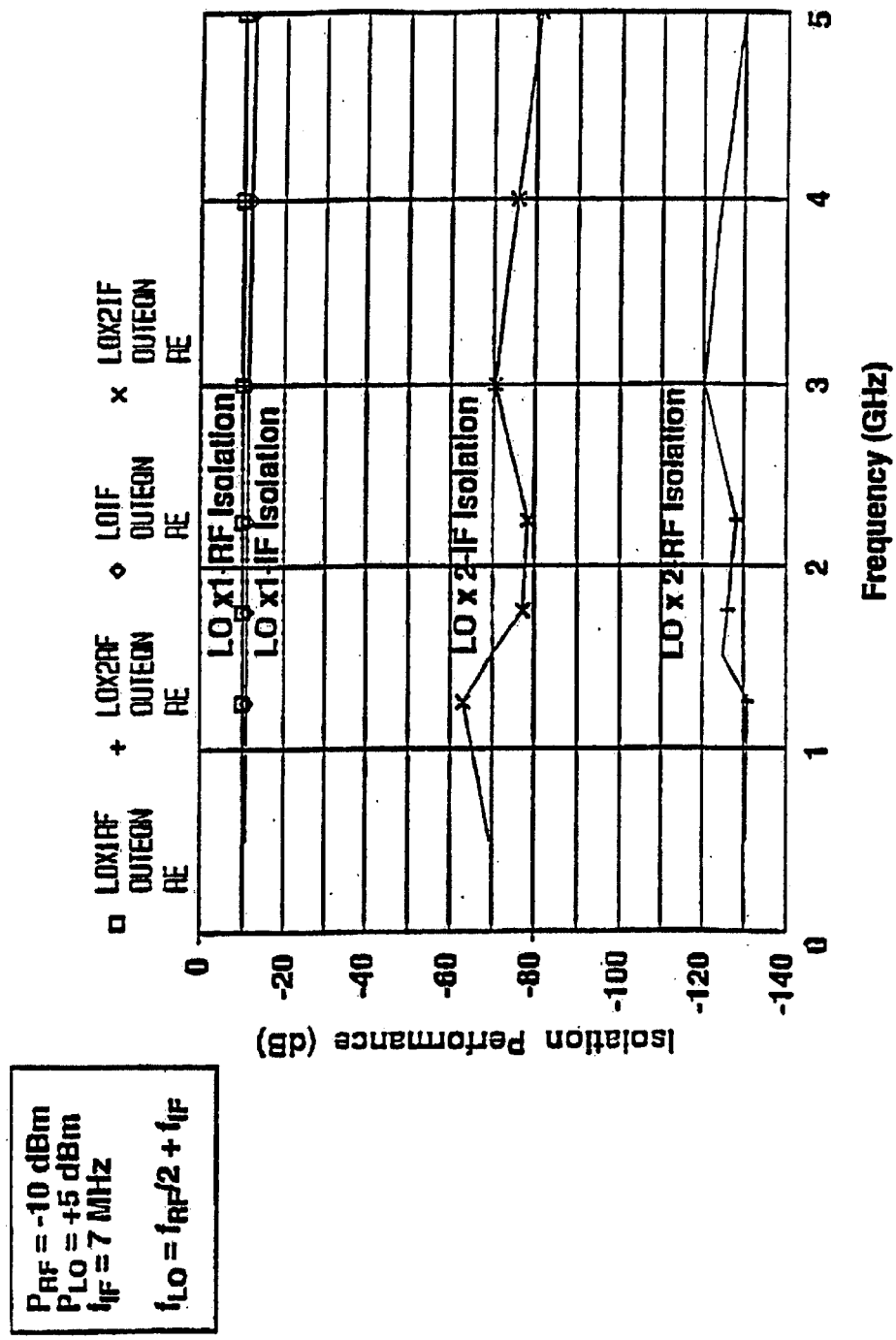
FIG. 10 is a graphical illustration of the fundamental LO and 2nd Harmonic LO isolation performance over the swept RF frequency band from 0.5–5 GHz.

FIG. 10 illustrates the fundamental LO and 2nd Harmonic LO isolation performance over the swept RF frequency band from 0.5–5 GHz and under the same conditions defined above. The fundamental LO-RF and LO-IF isolations are poor due to the fact that they are fundamental odd order mixer products which do not get canceled out in the harmonic mixer. However, because it is operated as a subharmonic mixer, these two products are easily filtered out by simple high and low pass filters. On the other hand, the 2nd Harmonic LO (LO×2)—IF isolation performance is better than −60 dB while the 2nd harmonic LO (LO×2)-RF isolation is better than −120 dB. This is indicative of the even order mixer product cancellation of the subharmonic mixer. The 2nd Harmonic LO×2-RF isolation is the most critical in the direct-conversion receiver because it is the 2nd LO harmonic tone at the RF port which self-mixes with the fundamental LO to produce a dc offset at the IF output. Moreover, this same 2nd harmonic LO tone appears in the RF frequency band at the antenna, and would result in undesired emissions if this LO×2-RF isolation were poor. However, as can be illustrated by the simulations, this invention shows a phenomenal LO×2-RF isolation of 120 dB.

Figure 11:
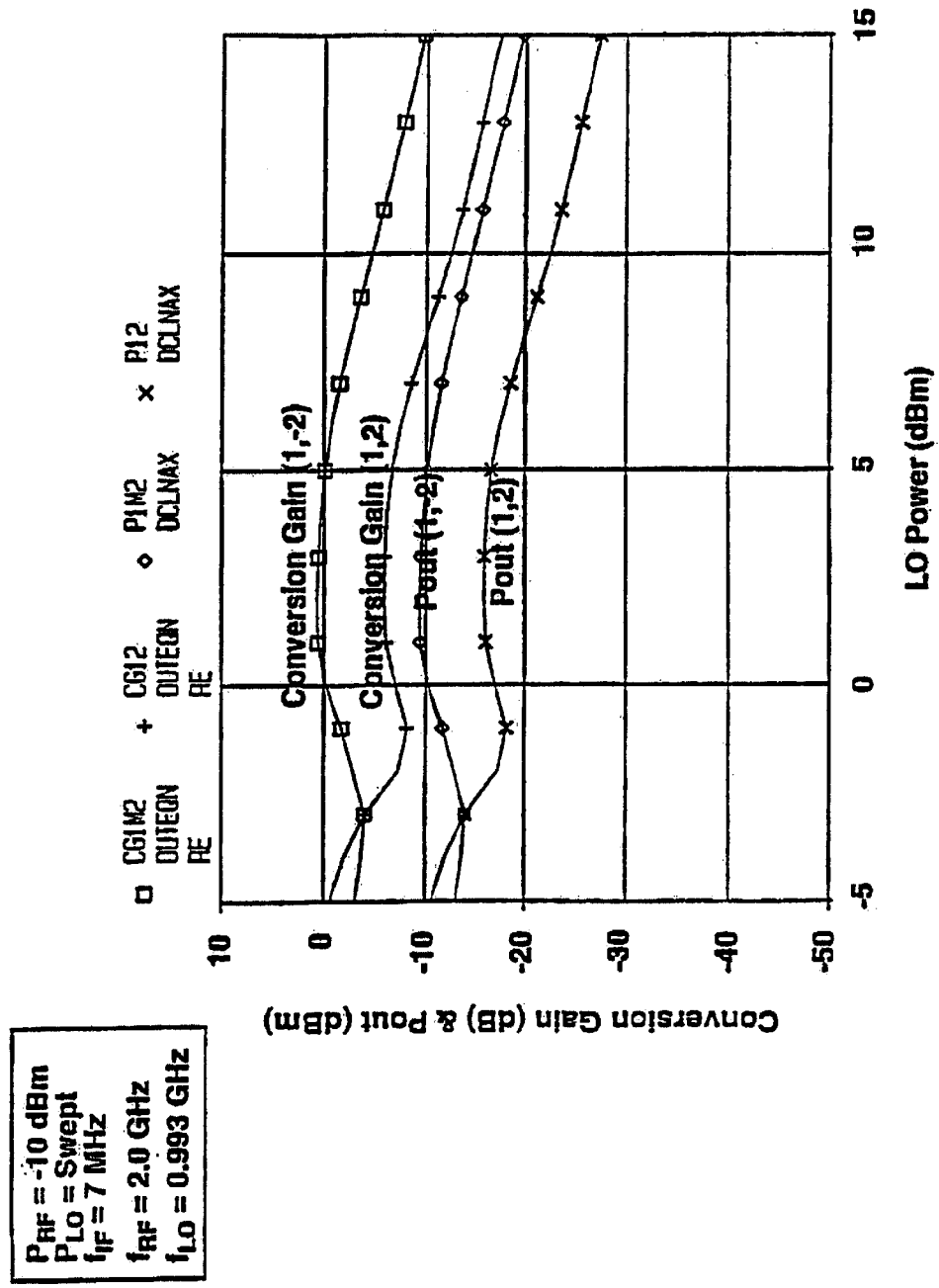
FIG. 11 is a graphical illustration of the conversion gains of the 2nd harmonic mixer products (1,–2) and (1,2) as well as their output powers as a function of LO input power for a harmonic mixer in accordance with the present invention.

FIG. 11 illustrates the conversion gains of the 2nd harmonic mixer products (1,−2) and (1,2) as well as their output powers as a function of LO input power. These simulations are for an RF input power of −10 dBm and a fixed IF frequency of 7 MHz. The RF frequency is set at 2 GHz while the LO frequency is set at 993 MHz. The conversion gains of the 2nd harmonic mixer products (1,−2) and (1,2) as well as their output powers, peak between 0 and 5 dBm of LO drive. The optimum LO drive level can be further optimized for lower LO drive by adjusting the bias resistors of $R_1$ and $R_2$ in the schematic of FIG. 8. Also note that in these simulations the LO port is not matched to 50%, but represents raw simulations of the subharmonic mixer of FIG. 8. Thus the conversion gain can be improved for a narrow RF input band.

Figure 12:
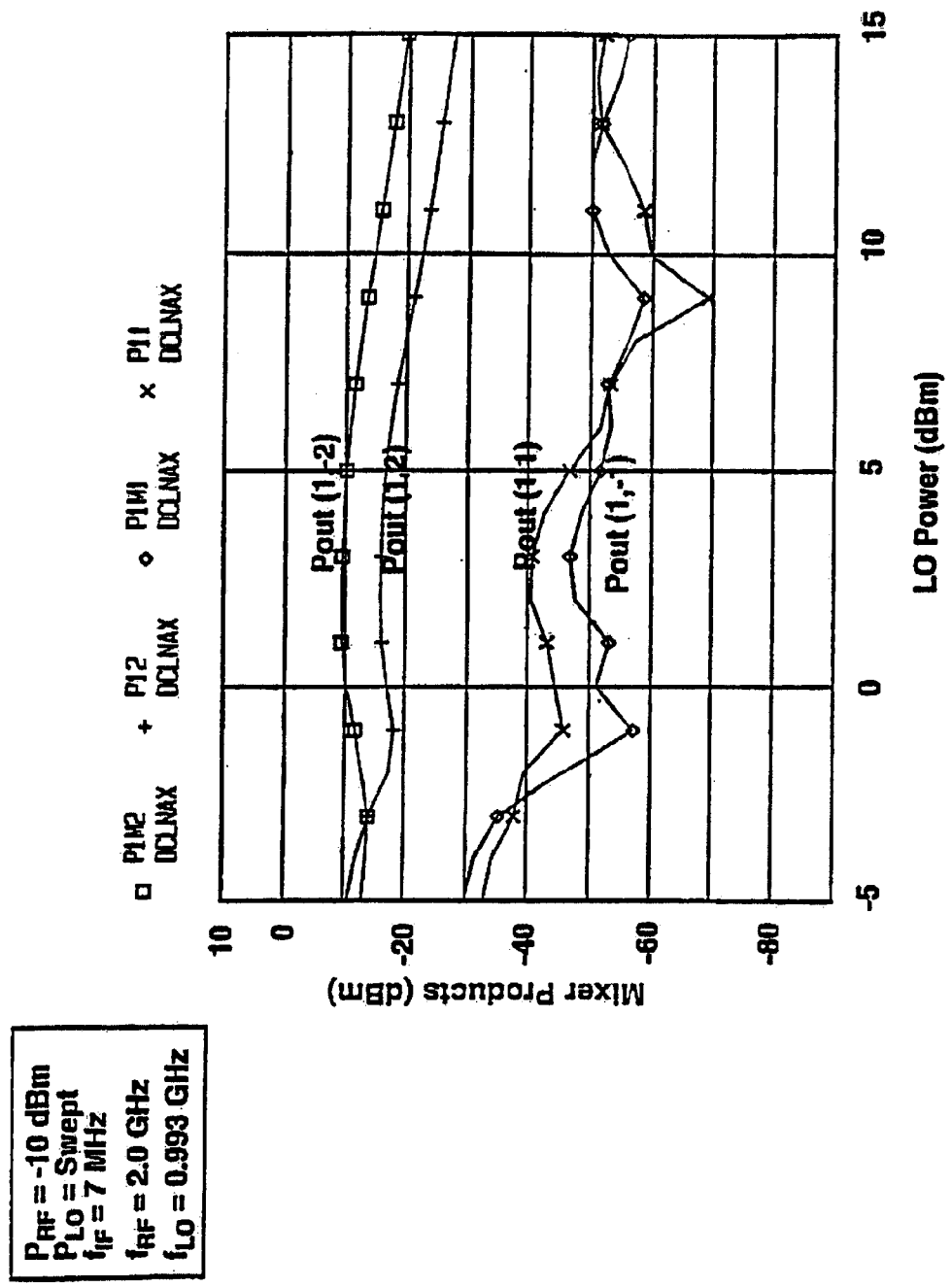
FIG. 12 is a graphical illustration of the fundamental (1,1) and (1,–1) and 2nd harmonic (1,2) and (1,–2) mixer product output powers as a function of LO input power for a harmonic mixer in accordance with the present invention.

FIG. 12 illustrates the fundamental (1,1) and (1,−1) and 2nd harmonic (1,2) and (1,−2) mixer product output powers as a function of LO input power. The (1,2) and (1,−2) products shown an optimum (high conversion gain) LO drive of between 0 and 5 dBm. The fundamental mixer product (1,1) and (1,−1) suppressing improves for increasing LO drive. Typical fundamental mixer suppression of 30–40 dB is exhibited for moderate LO power levels.

Figure 13:
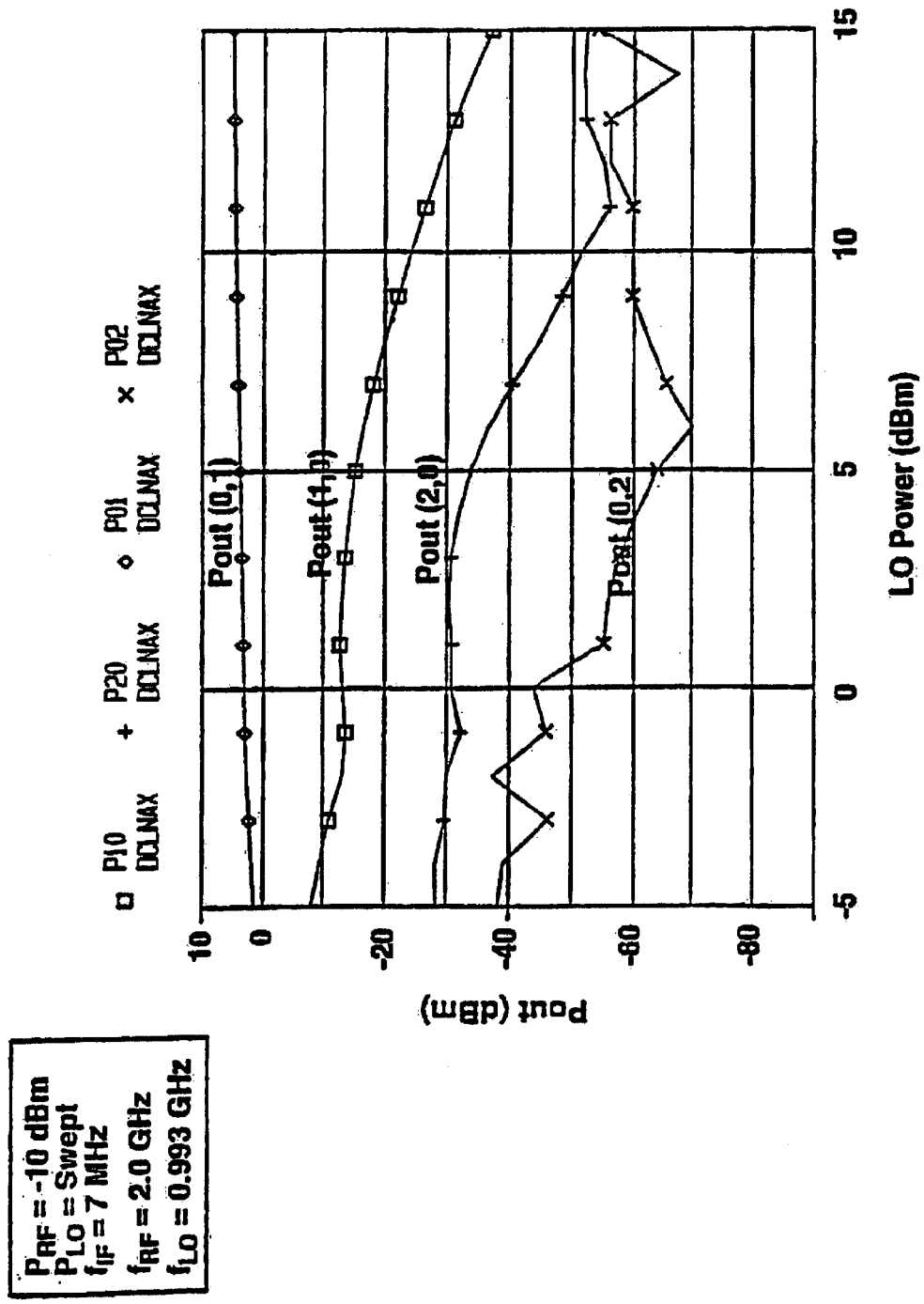
FIG. 13 is a graphical illustration of the RF and LO fundamental and 2nd harmonic mixer product output powers as a function of LO drive for a harmonic mixer in accordance with the present invention.

FIG. 13 illustrates the RF and LO fundamental and 2nd harmonic mixer product output powers as a function of LO drive. The fundamental LO (0,1) and RF (1,0) products are odd order mixer terms and therefore are not canceled at the IF output. The 2nd harmonic RF (2,0) and LO (0,2) products are even order mixer terms and therefore are suppressed by the harmonic mixer. The 2nd harmonic even order mixer product suppression is seen to improve with the increasing LO input power. In a direct-conversion receiver application, all these output products are of little consequence since they can be filtered by a simple low-pass filter. This Figure aids in verifying that the proposed harmonic mixer invention operates as a subharmonic mixer as proposed.

Figure 14:
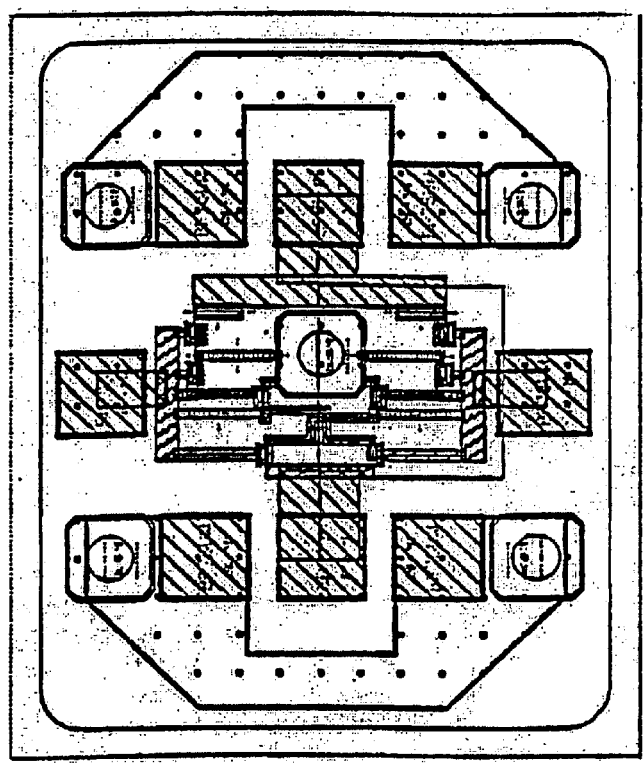
FIG. 14 is an exemplary layout of the direct-conversion complementary HBT harmonic mixer in accordance with the present invention.

FIG. 14 is an exemplary layout of the direct-conversion complementary HBT harmonic mixer. The total size is 0.67×0.54 mm².

Figure 15:
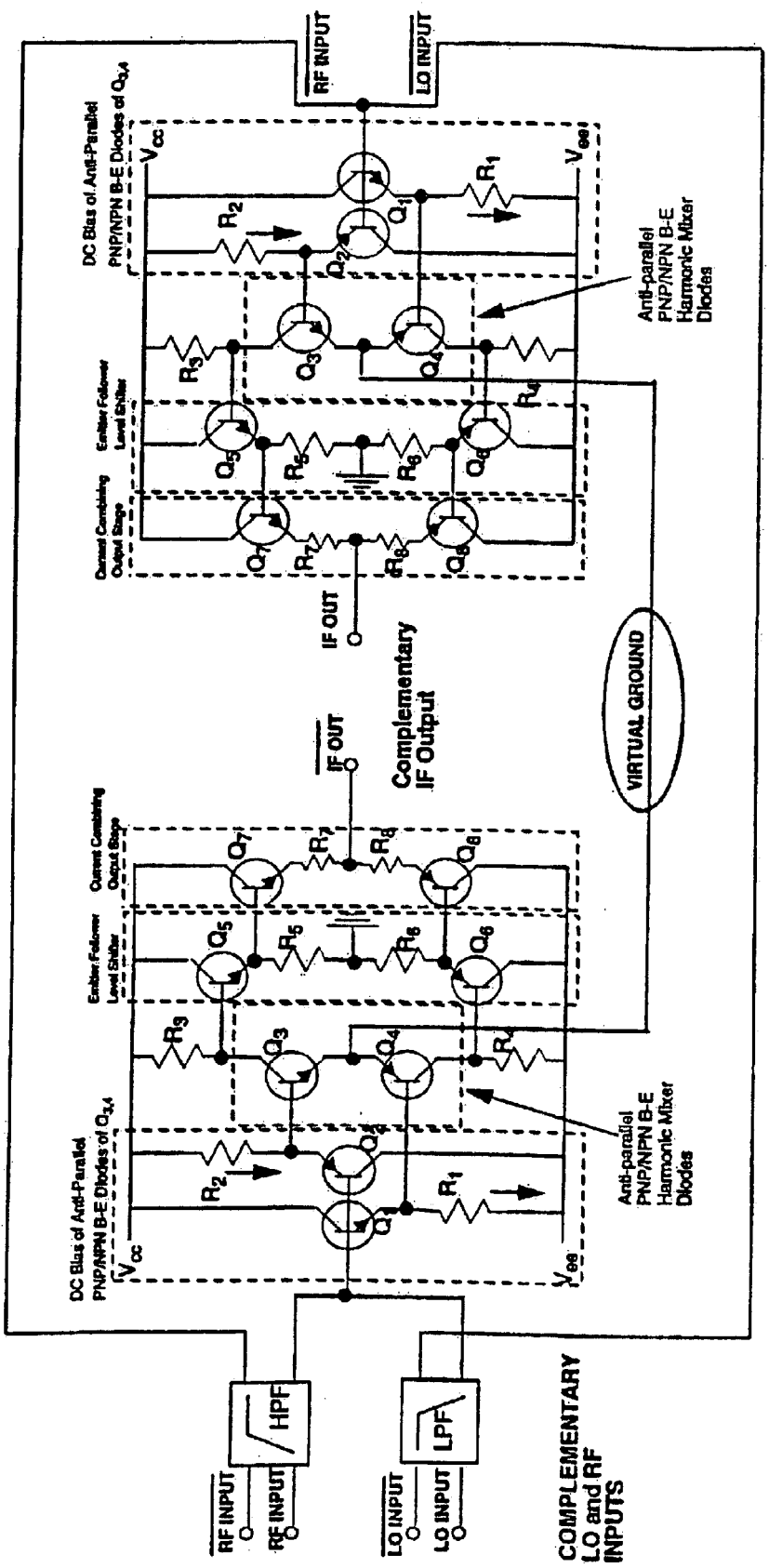
FIG. 15 is a schematic diagram of a balanced embodiment of the complementary bipolar harmonic mixer in accordance with the present invention.

In some applications, IC chip technologies may not be able to provide a sufficient low inductive ground. In this case, virtual grounds are exploited by using a balanced topology which is operated differentially and increases the circuit's immunity to common-mode noise. FIG. 15 illustrates an embodiment of the complementary bipolar harmonic mixer in a balanced configuration where the common ground node originally shared by transistors $Q_3$ and $Q_4$ of FIG. 8 is converted to a virtual ground.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A harmonic mixer comprising:
   a pair of complementary transistors coupled together;
   an input port; and
   an output port.

2. The harmonic mixer as recited in claim 1, wherein said pair of transistors are bipolar transistors.

3. The harmonic mixer as recited in claim 2, wherein said bipolar transistors are homojunction bipolar junction transistors.

4. The harmonic mixer as recited in claim 2, wherein said bipolar transistors are heterojunction bipolar transistors (HBT).

5. The harmonic mixer as recited in claim 1, wherein said pair of transistors are metal oxide semiconductor (MOS) transistors.

6. The harmonic mixer as recited in claim 1, wherein said pair of transistor high electron mobility transistors (HEMT).

7. A harmonic mixer comprising:
   a pair of complementary bipolar transistors defining first and second base terminals coupled together and defining an input port; first and second collector terminals coupled together with a capacitor disposed between said first and second collector terminals; and first and second emitter terminals coupled together and connected to ground; and
   an output port.

8. A harmonic mixer comprising:
   a pair of complementary bipolar transistors defining first and second base terminals coupled together and defining an input port; first and second collector terminals coupled together with a capacitor disposed between said first and second collector terminals; and first and second emitter terminals coupled together and connected to ground;
   an output port; and
   a first filter connected to said output port, said filter having an output which defines an intermediate frequency (IF) port.

9. The harmonic mixer as recited in claim 8, wherein said first filter is a low pass filter.

10. A harmonic mixer comprising:
    a pair of complementary bipolar transistors defining first and second base terminals coupled together and defining an input port; first and second collector terminals coupled together with a capacitor disposed between said first and second collector terminals; and first and second emitter terminals coupled together and connected to ground;
    an output port;
    a first filter connected to said output terminal, said filter having an output which defines an intermediate frequency (IF) port; and
    a second filter having an input defining a local oscillator (LO) input port connected to said input port.

11. The harmonic mixer as recited in claim 10, wherein said input port is also connected to a third filter having an input port defining an RF input port.

12. The harmonic mixer as recited in claim 11, wherein said second filter is a bandpass filter for passing a predetermined LO frequency.

13. The harmonic mixer as recited in claim 12, wherein said third filter is a bandpass filter for passing a predetermined RF frequency.

14. A harmonic mixer comprising:

a pair of complementary metal oxide semiconductor (MOS) transistors defining first and second gate terminals coupled together and defining an input port; first and second source terminals coupled together with a capacitor disposed between said first and second source terminals; and first and second drain terminals coupled together and connected to ground, and an output port.

15. A harmonic mixer comprising:

a pair of complementary metal oxide semiconductor (MOS) transistors defining first and second gate terminals coupled together and defining an input port; first and second source terminals coupled together with a capacitor disposed between said first and second source terminals; and first and second drain terminals coupled together and connected to ground;

an output port; and a first filter connected to said output port, said filter having an output which defines an intermediate frequency (IF) port.

16. The harmonic mixer as recited in claim 15, wherein said first filter is a low pass filter.

17. A harmonic mixer comprising:

a pair of complementary metal oxide semiconductor (MOS) transistors defining first and second gate terminals coupled together and defining an input port; first and second source terminals coupled together with a capacitor disposed between said first and second source terminals; and first and second drain terminals coupled together and connected to ground;

an output port;

a first filter connected to said output port, said filter having an output which defines an intermediate frequency (IF) port; and a second filter having an input defining a local oscillator (LO) input port connected to said input port.

18. The harmonic mixer as recited in claim 17, wherein said input port is also connected to a third filter having an input port defining an RF input port.

19. The harmonic mixer as recited in claim 18, wherein said second filter is a bandpass filter for passing a predetermined LO frequency.

20. The harmonic mixer as recited in claim 19, wherein said third filter is a bandpass filter for passing a predetermined RF frequency.

* * * * *